(12) United States Patent
Dull

(10) Patent No.: US 6,322,955 B1
(45) Date of Patent: Nov. 27, 2001

(54) ETCHING METHOD

(75) Inventor: Dennis L. Dull, Sumner, WA (US)

(73) Assignee: The Boeing Company, Seattle, WA (US)

(*) Notice: Subject to any disclaimer, the term of this patent is extended or adjusted under 35 U.S.C. 154(b) by 0 days.

(21) Appl. No.: 08/465,077

(22) Filed: Jun. 5, 1995

Related U.S. Application Data

(62) Division of application No. 08/147,183, filed on Nov. 3, 1993, now Pat. No. 5,468,409.

(51) Int. Cl.[7] .................... G03F 7/40; C23F 1/00
(52) U.S. Cl. ............... 430/318; 430/323; 430/277.1; 216/105; 216/106; 216/41
(58) Field of Search ..................... 430/323, 318; 216/105, 106, 41

(56) References Cited

U.S. PATENT DOCUMENTS

| | | | |
|---|---|---|---|
| 3,083,129 | * 3/1963 | Jones et al. | 216/106 |
| 3,650,958 | * 3/1972 | Shipley, Jr. | 216/105 |
| 3,753,818 | 8/1973 | Poor et al. | 156/19 |
| 4,388,388 | * 6/1983 | Kornbau et al. | 430/258 |
| 4,696,717 | 9/1987 | Bissinger | 156/642 |
| 5,298,117 | 3/1994 | Hanson et al. | 156/666 |

FOREIGN PATENT DOCUMENTS 2149-684-A   6/1990   (JP).

OTHER PUBLICATIONS

Missel et al, "Steady State Etching of Copper; Cupric Chloride–Sodium Chloride Baths", Metal Finishing, Dec. 1969, pp. 47–52, 58, Dec. 1969.*

* cited by examiner

*Primary Examiner*—Cynthia Hamilton
(74) *Attorney, Agent, or Firm*—John C. Hammer

(57) ABSTRACT

Multicurved copper films having fine-line elements suitable for radome applications can be improved by cutting the elements with reproducible precision to close tolerance (typically line widths of 3–10±0.25 mil) using an etchant comprising a concentrated saline solution of $CuCl_2$.

20 Claims, 2 Drawing Sheets

ETCHING METHOD

REFERENCE TO RELATED APPLICATIONS

The present application is a divisional application based upon U.S. patent application Ser. No. 08/147,183, filed Nov. 3, 1993, now U.S. Pat. No. 5,468,409.

TECHNICAL FIELD

The present invention relates to a solution for etching copper and its method of use to make fine-line copper elements where the etching is precise to close tolerance. The method is particularly suited for articles having complex curvature. The copper elements are commonly used in radomes.

BACKGROUND ART

Circuit board elements are often etched on flat, plated surfaces in conventional etching processes using photolithographic techniques to define lines to specific tolerances of about ±1.0 mil (i.e., 0.001 in). The initial line width of typically about 2–15 mils is patterned in the photoresist before introducing the etchant. Generally, a strong acid such as ferric chloride is used as the etchant. Ferric chloride penetrates quickly through the copper film, and, because of its vigorous etch rate, only modest tolerances are achievable. The etchant begins to etch laterally (i.e., undercut) as it simultaneously continues to etch into the metal. The initial photoresist pattern must define openings in the photoresist narrower than the desired line width in the metal, because undercutting will occur. The etchant will penetrate beneath the photoresist film. The circuit board etching process must be monitored closely so that etching can be halted at the precise time. With a conventional etching process, like those using ferric chloride, it is difficult, if not impossible, to achieve line widths ranging from 3–10 ±0.25 mils (0.003–0.010 in) even on flat boards, because of the etch rate and inherent process delays. Our applications require this close tolerance on large parts having complex curvature. Control of line width is more difficult if the film has a complex curvature. With large parts, it becomes more difficult to flush or to neutralize the etchant to stop the etching. Using$_8$ conventional circuit board etching processes, this precision is lost.

SUMMARY OF INVENTION

An etching solution especially valuable for precision etching of vapor deposited copper films of complex curvature comprises about 0.5 ft$^3$ etchant/ft$^2$ copper film (with a nominal thickness of about 0.1 mil), the solution being about 5 gm per liter of a mild copper etching acid, such as CuCl$_2$, and at least about 125 gm per liter of NaCl or another suitable salt in deionized water. We reproducibly achieve line widths of about 3–10 mil ±0.25 mil.

DESCRIPTION OF THE INVENTION

Figure 1:
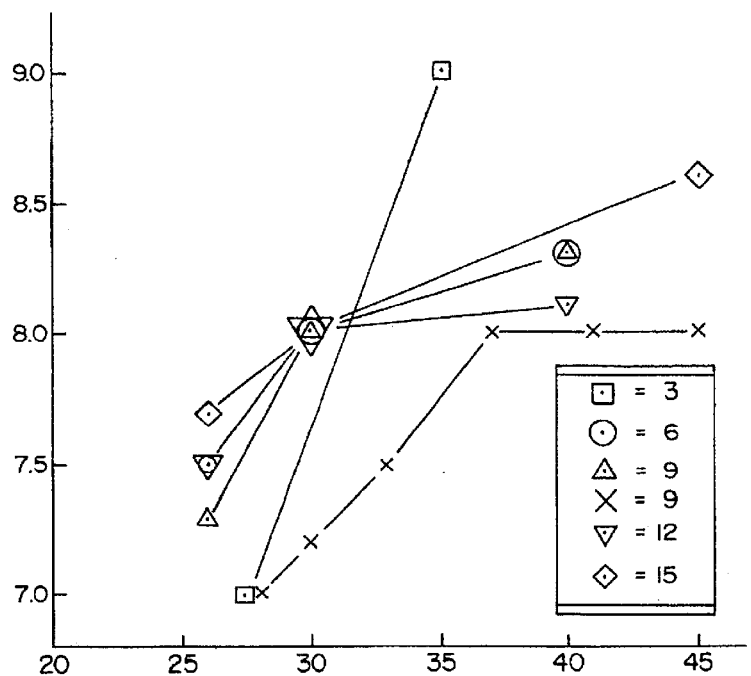
FIG. 1 is a graph showing the line width of etched copper in mils on the ordinate versus immersion time in minutes on the abscissa of the copper in a preferred etchant of the present invention for various exposure times in minutes for the photoresist.

Controlling undercut in metal etching using photolithographic techniques is essential reproducibly and reliably to achieve close tolerances as small as ±0.00025 in (0.25 mil) on copper circuit board elements, especially for elements having complex curvature, such as those needed for radome applications. By using a mild copper etchant having a slow and well-defined etch rate, such as one containing dilute CuCl$_2$ and concentrated NaCl in deionized water, we can achieve a precision etch on large vapor deposited copper parts with lines controllably cut to the desired tolerance of ±0.25 mil using otherwise standard dip tank chemical etching equipment. Our preferred etchant comprises about 5 gm CuCl$_2$ and 150 gm NaCl per liter of deionized water. Our tests with this preferred saline etchant on vapor deposited copper using about 0.5 ft$^3$ etchant/ft$^2$ Cu show that the etch rate declines significantly (to less than 0.01 mil/min). With this etchant, then, we can immerse a large, multicurved element and can etch it precisely to close tolerance over relatively long immersion times because the etch rate decline is so dramatic that continued exposure to etchant has almost no effect. With this etchant, we have minimized the effects otherwise caused by relative orientation, solution depth, temperature distribution, natural convection, migration or electrolytic effects, and the like in producing etched copper circuit elements of line widths between about 3–10±0.25 mil for vapor deposited copper on plastic circuit board substrates.

In the method, we generally use conventional photolithography (i.e., a photoresist) to mask the copper and pattern the mask to expose line widths approximately 1 mil narrower than the desired final width. Typically, the copper is vapor deposited to a nominal thickness of about 0.1 mil. We use 0.5 ft$^3$ etchlant/ft$^2$ Cu. The etchant has a composition of about 5 gm CuCl$_2$ and at least about 150 gm NaCl per liter deionized water (purity >1 megaohm-cm). The etchant is heated to about 140° F.±3° F. when the board is immersed in a quiescent, stagnant tank. The board remains immersed for about 25–45 minutes, and, preferably, 25–30 minutes before it is checked for completion. The part is monitored after checking until the desired line width is achieved. During immersion, there is no agitation. We have achieved repeatable, reliable etching to precise dimensions between 3–10 mil width with close tolerances of about ±0.25 mil on line width for all the lines.

The etchant is a mild acid so that its etch rate will be relatively slow. We typically use this process for etching large parts of high value to close tolerances where line width is important to control to achieve the desired functional performance. In this case, the etching time is insignificant. Therefore, we prefer a slow etch rate that helps us to achieve the close tolerances we need. We have found that the etch rate for this preferred solution declines to a very low rate at the point where our etch is essentially complete. Thereafter, we do not need to race to neutralize the etchant or to flush the part. Other conventional copper etchants like ferric chloride did not provide us with the control we needed.

Figure 2:
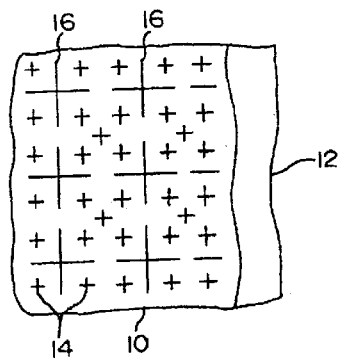
FIG. 2 is a schematic plan view of a portion of the copper film etched in the process of the present invention.

FIG. 2 shows a typical copper film 10 of nominal thickness of about 0.1 mil vapor deposited on a suitable circuit board substrate 12 and etched with the process of the present invention. Fine-line Jerusalem Crosses 14 have been cut in the film 10 to line widths of between about 3–10±0.25 mils. Elements 16 are larger, showing that not all the elements in the desired pattern need to be the same size. The close tolerances are reproducibly and reliably achieved with proper masking and monitored immersion in the dip tank.

The concentrated saline solution functions to minimize or eliminate any migration or electrolytic effects that otherwise might upset control of the etch. While we use at least about 150 gm/l NaCl, other common salts or mixtures of salts and other concentrations can be used, as those skilled in the art will recognize. We suggest a concentration of about 125 gm/l. This concentration ensures that the solution will not undergo significant electrolytic changes during the etching process.

The solution is a dilute acid, typically containing only about 5 gm/l $CuCl_2$. We discovered that the etch rate is so low in this case (at least near completion of the etch) that using a heated solution is desirable to accelerate the etch rate at the outset. We suggest immersing the part in a conventional dip tank for chemical etching filled with the preferred $CuCl_2$ saline solution heated to about 140±3° F. We have not thoroughly investigated the relationship between the etchant temperature and the etch rate, but speculate that other temperatures could be used without losing control of the ultimate line width. A lower temperature is preferred to reduce natural convection effects that might disrupt the fine control we need. Convection could make it difficult to obtain fine-line control to the 0.25 mil tolerance over the entire surface of the large, curved parts for which this process is designed and the functionality we need could be lost.

We endeavor to make the process diffusion driven and have attempted to minimize the contribution of migration or convection.

While 5 gm/l $CuCl_2$ is preferred, other concentrations of the acid could undoubtedly be used without loss of control of the line width. We, however, have not investigated to any great degree the relationship between acid concentration and etch rate. We have discovered that using about 5 gm/l $CuCl_2$ in concentrated saline provides an etch rate after about 25–30 minutes immersion of our part slow enough that there is no criticality in quickly removing the part from the tank, neutralizing the acid, or flushing the part. This feature is particularly beneficial when working with fine details on large parts of complex curvature where flushing and neutralizing cannot occur simultaneously everywhere on the part.

The pH of our preferred solution is about 3.6. After etching, the solution has a pH of about 3.8.

FIG. 1 shows our test results on sample parts overcoated with photoresist exposed for differing lengths of time. This data suggests that the photoresist exposure be in the range of about 6–12 minutes, but we have run only a small number of tests. In each case illustrated in FIG. 1, the test specimen included a photomask of nominal line width of about 7 mils with a target final etched line width of 8.0±0.25 mils on the 0.1 mil thick vapor deposited copper.

The mask is designed so that the exposed initial line width is about 1.0 mil less than the final desired line width (for 0.1 thick copper). For thicker films, the initial line width might vary, but we have not done sufficient testing to discover the relationship between initial line width and film thickness to achieve final line widths of ±0.25 mil tolerance. Our films of interest are 0.1 mil thick vapor deposited copper of complex curvature. FIG. 1 shows the slow etch (or the etch rate decline) when line widths of the desired nominal width (here 8.0 mils) are met. This etch rate decline helps us finish the widths to the close tolerances we require across the part.

Figure 3:
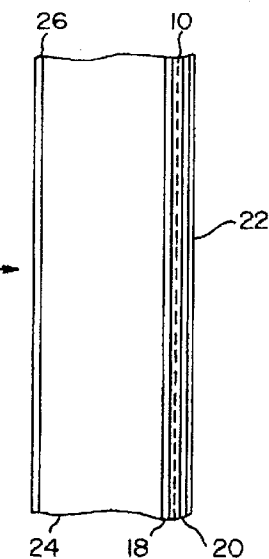
FIG. 3 is a schematic cross-section representation of the copper film of FIG. 2 incorporated into a radome.

FIG. 3 schematically illustrates use of the etched copper film 10 in a radome 100. The film 10 may be secured between two dielectric sheets 18 and 20 near one face of the radome 100. Dielectric sheet 20, in turn, is adhered to a toughened resin composite skin 22. On the other face, the dielectric sheet 18 is adhered to a honeycomb core 24 that, in turn, has a toughened resin composite skin 26 on its outer, exposed face. If desired, several layers of copper film 10 in capacitive or inductive configurations or both separated by dielectric layers may be used. Of course, those skilled in the art will recognize other practical radome constructions where the etched copper film 10 can be used.

Figure 4:
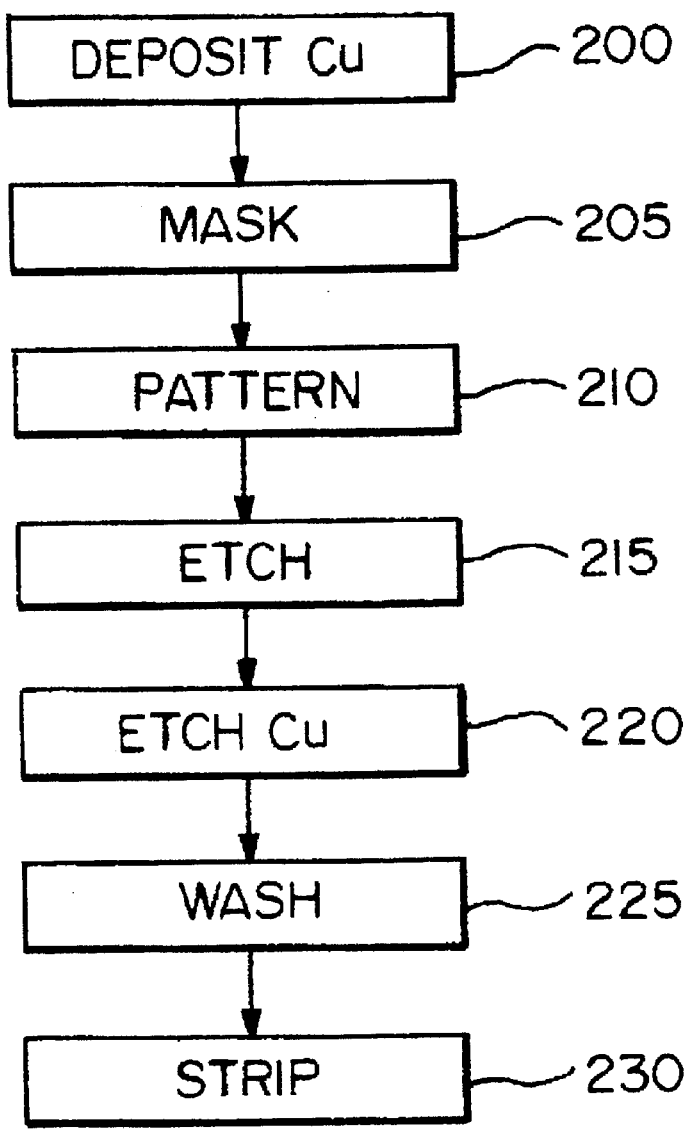
FIG. 4 is a block diagram of a preferred etching process.

FIG. 4 shows the overall process in block form. In the first operation 200, copper film 10 is vacuum deposited on a suitable substrate 12. Then, the film 10 is masked with a suitable photoresist (step 205), followed by patterning the photoresist to identify the intended fine-line elements (step 210). The patterning typically involves exposing selected portions of the photoresist to ultraviolet (UV) radiation which alters the exposed photoresist and which permits its selective removal or etching in step 215 to yield the masked film 10 with openings through the photoresist in the desired pattern. Next, the masked film is immersed in the copper etchant dip tank (step 220) to form the fine-line elements in the copper film. After the etch is complete, the film is washed in step 225 and the photoresist is then stripped (typically by exposing it to UV with subsequent etch) from the film (step 230) to leave the desired product on the protective substrate.

While preferred embodiments have been described, those skilled in the art will recognize modifications or variations which might be made without departing from the inventive concept. Therefore, the description and claims should be interpreted liberally with only such limitation as is necessary in view of the pertinent prior art.

I claim:

1. A method for etching a copper film with reproducible precision to close tolerance to define fine-line elements, comprising the step of:

immersing the film in an aqueous etchant solution of pH 3.6 containing an effective amount of cupric chloride and at least about 125 gm/l sodium chloride to etch copper from the film for a period of time sufficient to achieve the desired fine-line elements in the copper.

2. The method of claim 1 wherein the solution quantity is about 0.5 ft$^3$ etchant solution/ft$^2$ copper.

3. The method of claim 1 wherein the solution is quiescent during the immersion.

4. The method of claim 2 wherein the concentrations are about 5 gm $CuCl_2$: 150 gm NaCl: liter $H_2O$.

5. The method of claim 4 wherein the immersion time is about 25–30 minutes.

6. The method of claim 1 wherein the copper is vapor deposited onto a substrate and wherein the copper is photolithographically masked to define the fine-line elements.

7. The method of claim 6 wherein the copper thickness is about 0.1 mil and the solution quantity is about 0.5 ft$^3$ etchant solution/ft$^2$ copper film.

8. The method of claim 1 wherein the water is deionized and has an initial purity of greater than 1 megaohm-cm.

9. The method of claim 1 wherein the precision and tolerance produce fine line widths of about 3–10 mil ±0.25 mil.

10. The method of claim 1 wherein the copper film is curved.

11. The method of claim 1 further comprising the steps of:
    masking the film with photoresist;
    patterning the photoresist to expose portions of the film where fine-line elements will be etched;

etching the exposed portions during the immersion; and stripping the remaining photoresist to leave a patterned film having fineline elements to a line tolerance of at least about ±0.25 mil.

12. The method of claim 11 wherein the patterned copper film has line widths of about 3–10 mils.

13. The method of claim 11 wherein the solution is maintained quiescent during immersion at a temperature of about 140±3° F.

14. The method of claim 11 wherein the film is about 0.1 mil thick.

15. The method of claim 11 wherein the film is vapor deposited on a substrate.

16. The method of claim 11 wherein the copper film has a multicurved surface where the pattern of fine-line elements is etched.

17. A method for etching a copper film with reproducible precision to close tolerance to define fine-line elements, comprising the steps of:

immersing the film in an aqueous etchant solution containing cupric chloride and sodium chloride for a period of time sufficient to achieve etching to a tolerance of about ±0.25 mil, using about 0.5 ft$^3$ etchant solution/ft$^2$ copper film.

18. A method for etching a curved copper film to produce a patterned film with fine-line elements etched to a tolerance of about ±0.25 mil on all lines, the patterned film being a frequency selective surface suitable for use in a radome, comprising the steps of:

(a) patterning a photolithographic mask deposited on the copper film to expose line widths approximately 1 mil narrower than the desired final width; and (b) etching the exposed copper to create fine-line elements in the film to a tolerance of about ±0.25 mil on all lines by immersing the masked film in a quiescent, dilute cupric chloride etching solution having at least about 125 gm/l NaCl sufficient to eliminate any migration or electrolytic effects, the etch rate of the solution declining to less than 0.01 mil/min when the desired etch is complete.

19. The method of claim 18 wherein the etching solution has 5 gm/l cupric chloride.

20. The method of claim 18 wherein the ratio of solution to copper is about 0.5 ft$^3$ solution /ft$^2$ exposed copper.

* * * * *